(12) United States Patent
Liao et al.

(10) Patent No.: US 7,880,479 B2
(45) Date of Patent: Feb. 1, 2011

(54) CAPACITIVE SENSOR WITH ALTERNATING CURRENT POWER IMMUNITY

(75) Inventors: Tung-Tsai Liao, Hsin Chu (TW); Li Sheng Lo, Hsin Chu County (TW)

(73) Assignee: Generalplus Technology, Inc., Hsin-Chu (TW)

( * ) Notice: Subject to any disclaimer, the term of this patent is extended or adjusted under 35 U.S.C. 154(b) by 94 days.

(21) Appl. No.: 11/984,413

(22) Filed: Nov. 16, 2007

(65) Prior Publication Data

US 2009/0045821 A1 Feb. 19, 2009

(30) Foreign Application Priority Data

Aug. 17, 2007 (CN) .......................... 2007 1 0141977

(51) Int. Cl.
*G01R 27/26* (2006.01)
(52) U.S. Cl. .................. 324/679; 331/111; 331/100; 341/33
(58) Field of Classification Search .................. 324/679
See application file for complete search history.

(56) References Cited

U.S. PATENT DOCUMENTS

| 3,746,891 | A * | 7/1973 | Rowe .......................... 327/129 |
|---|---|---|---|
| 4,623,851 | A * | 11/1986 | Abou .......................... 331/111 |
| 2003/0001683 | A1* | 1/2003 | Kawajiri et al. .............. 331/100 |
| 2004/0160234 | A1* | 8/2004 | Denen et al. ................. 324/679 |
| 2004/0217886 | A1* | 11/2004 | Horton et al. ................. 341/33 |
| 2005/0248534 | A1* | 11/2005 | Kehlstadt ..................... 345/163 |
| 2007/0159184 | A1* | 7/2007 | Reynolds et al. ............ 324/662 |
| 2007/0281646 | A1* | 12/2007 | Itaya et al. ............... 455/197.2 |
| 2008/0036444 | A1* | 2/2008 | Paulus et al. ............... 324/71.1 |

* cited by examiner

*Primary Examiner*—Melissa J Koval
*Assistant Examiner*—Benjamin M Baldridge
(74) *Attorney, Agent, or Firm*—Muncy, Geissler, Olds & Lowe, PLLC

(57) ABSTRACT

A capacitive sensor includes a sensing electrode, control unit, first and second comparator wherein the sensing electrode includes a first and a second conductors. A positive input terminal of the first comparator and a negative input terminal of the second comparator are coupled to the first conductor. A positive input terminal of the second comparator and a negative input terminal of the first comparator are coupled to the second conductor. The first and second comparators respectively output first and second comparing signals according to voltages of the positive and the negative terminals thereof. The control unit charges the first conductor and discharges the second conductor when the first and second comparing signals correspondingly are in first and second logic states. The control unit is operable on the contrary when the first and second comparing signals are in opposition to the abovementioned description.

5 Claims, 5 Drawing Sheets when a conductor touches the sensing electrode

US 7,880,479 B2

CAPACITIVE SENSOR WITH ALTERNATING CURRENT POWER IMMUNITY

This application claims the benefit of the filing date of Chinese Application Ser. No. "200710141977.5", filed on "Aug. 8, 2007", the content of which is incorporated herein by reference.

BACKGROUND OF THE INVENTION

1. Field of the Invention

The present invention relates to a capacitive sensor, and more particularly, to a capacitive sensor with alternating current power immunity.

2. Description of the Related Art

In recent years, due to the development of technology, control buttons, such as buttons of an elevator or a game console, evolve from a mechanical type of button into a touch sensor. FIG. 1 illustrates a circuit diagram depicting a capacitive touch sensor in the prior art. Referring to FIG. 1, the capacitive touch sensor includes a sensing electrode 101, a resistor 102 and a sensing-control terminal 103, wherein the sensing electrode 101 in the circuit is equivalent to a grounded capacitor Cx.

FIG. 2 illustrates an operational waveform diagram of a node A coupled to the sensing electrode 101 and the resistor 102. Referring to FIGS. 1 and 2, the sensing-control terminal 103 charges the node A to a first preset voltage V20 at the beginning, and then the node A is set to high-impedance. Afterward, since the sensing electrode 101 is equivalent to the grounding capacitor Cx, the sensing electrode 101 starts to discharge through the resistor 102. The sensing-control terminal 103 continuously detects a voltage of node A. When the voltage of node A discharges to a second preset voltage V21, the sensing-control terminal 103 determines whether a finger touches the sensing electrode according to a period when the voltage of the node A is discharged from the first preset voltage V20 to the second preset voltage, and then the sensing-control terminal 103 begins to charge the node A.

Referring to FIG. 2, the waveform 201 is a voltage waveform of node A when the finger does not touch the sensing electrode 101, and the waveform 202 is a voltage waveform of node A when the finger touches the sensing electrode 101. According to the waveforms, when the finger touches the sensing electrode 101, the equivalent capacitor of the sensing electrode 101 is increased, so that a discharge time T2 of the waveform 202 is longer than a discharge time T1 of the waveform 201. Therefore, as long as it is determined that the period when the voltage of node A is discharged from the first preset voltage V20 to the second preset voltage V21 is longer than the discharge time T1 by the sensing-control terminal, it can be determined that the sensing electrode 101 is touched.

However, the conventional capacitive sensor is much subjected to the interference of the alternating current (AC) signal, especially the interference of the AC power source in our daily life. Since the sensing electrode of the conventional capacitive sensor discharges to ground, the conventional capacitive sensor is comparative to ground to measure the equivalent capacitance of the sensing electrode. If the capacitive sensor is disposed to mobile apparatus, the ground of the sensing electrode is the battery ground. The battery ground is different from the environment's ground. When the interference of the AC power source is induced, the relationship between the battery ground and the environment ground will start to float. In other words, the outside environment observed by the battery system is a floating environment when the interference of the AC power source is existed. Thus, the measurement of the equivalent capacitance will be inaccurate.

SUMMARY OF THE INVENTION

In view of the above-mentioned problems, the present invention is direct to a capacitive sensor for prevention the interference of the AC power source to let the sensor become more accurate. The capacitive sensor does not limit to use the battery to be a power source or to use in a place with less interference of the AC power source.

To achieve the above-mentioned object and others, a capacitive sensor is provided. The capacitive sensor includes a sensing electrode, a first comparator, a second comparator and a control unit. The sensing electrode includes a first conductor and a second conductor. A positive input terminal of the first comparator is coupled to the first conductor. A negative input terminal of the first comparator is coupled to the second conductor. An output terminal of the first comparator outputs a first comparing signal according to the voltages of the positive input terminal thereof and the negative input terminal thereof. A positive input terminal of the second comparator is coupled to the second conductor. A negative input terminal of the second comparator is coupled to the first conductor. An output terminal of the second comparator outputs a second comparing signal according to the voltages of the positive input terminal thereof and the negative input terminal thereof. The control unit receives the first comparing signal and the second comparing signal. When the first comparing signal is a first logic voltage and the second comparing signal is a second logic voltage, a first output terminal of the control unit charges the first conductor and a second output terminal of the control unit discharges the second conductor. When the first comparing signal is the second logic voltage and the second comparing signal is the first logic voltage, the first output terminal of the control unit discharges the first conductor and the second output terminal of the control terminal charges the second conductor. The control unit outputs a sensing signal according to the first comparing signal and the second comparing signal.

According to the capacitive sensor in the embodiment of the present invention, the control unit includes a RS flip-flop, a first impedance and a second impedance. The RS flip-flop includes a set terminal, a reset terminal, a Q terminal and an inverted Q terminal. The set terminal of the RS flip-flop is coupled to the output terminal of the first comparator. The reset terminal of the RS flip-flop is coupled to the output terminal of the second comparator. The Q terminal of the RS flip-flop outputs the sensing signal. A first terminal of the first impedance is coupled to the Q terminal of the RS flip-flop. A second terminal of the first impedance is coupled to the first conductor. A first terminal of the second impedance is coupled to the inverted Q terminal of the RS flip-flop. A second terminal of the second impedance is coupled to the second conductor.

According to the capacitive sensor in the embodiment of the present invention, the capacitive sensor includes N sensing electrodes. Each sensing electrode comprises a first conductor and a second conductor. In an $i^{th}$ sensing time, the positive input terminal of the first comparator and the negative input terminal of the second comparator are coupled to the first conductor of the $i^{th}$ sensing electrode, the negative input terminal of the first comparator and the positive input terminal of the second comparator are coupled to the second conductor of the $i^{th}$ sensing electrode. Whether an $i^{th}$ sensing electrode is touched by a conductor is determined according to the period of the sensing signal in $i^{th}$ time interval, wherein N and i are natural numbers.

The essence of the present invention is to apply the principle of the oscillator, where the first conductor of the sensing electrode and the second conductor of the sensing electrode are alternately charged and discharged. Because the present invention is for detecting the voltage difference between the first conductor and the second conductor, where the variation of the voltage of the first conductor and the variation of the voltage of the second conductor are the same phase when the interference of the AC power source occurs. Thus, the relative value thereof is not subjected to the interference of the AC power source to change.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

EMBODIMENT OF THE INVENTION

Figure 1:
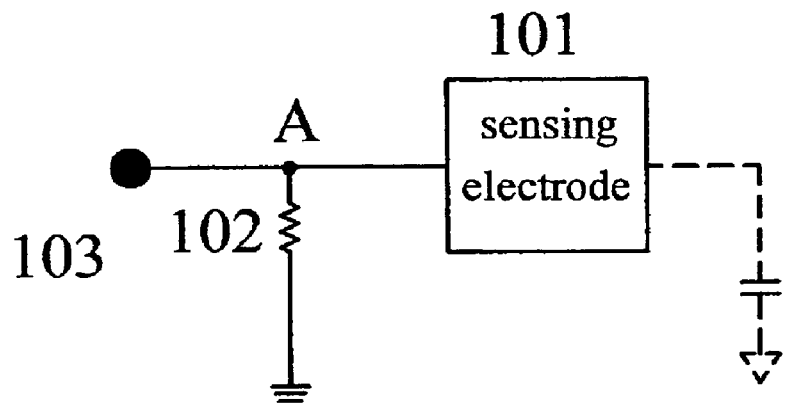
FIG. 1 illustrates a circuit diagram depicting a capacitive sensor in the prior art.
Figure 2:
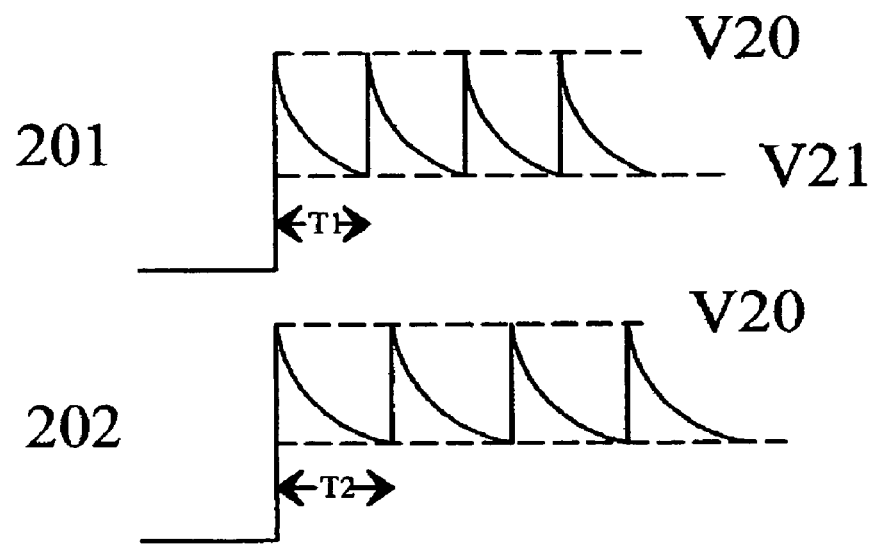
FIG. 2 illustrates an operational waveform diagram of node A coupled by the sensing electrode 101 and the resistor 102 in the prior art.
Figure 3:
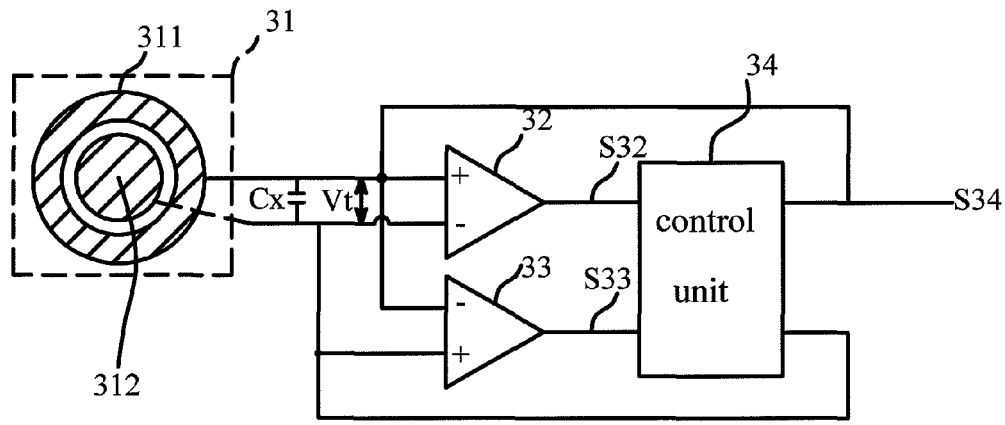
FIG. 3 illustrates the circuit diagram depicting the capacitive sensor according to an embodiment of the present invention.
Figure 4:
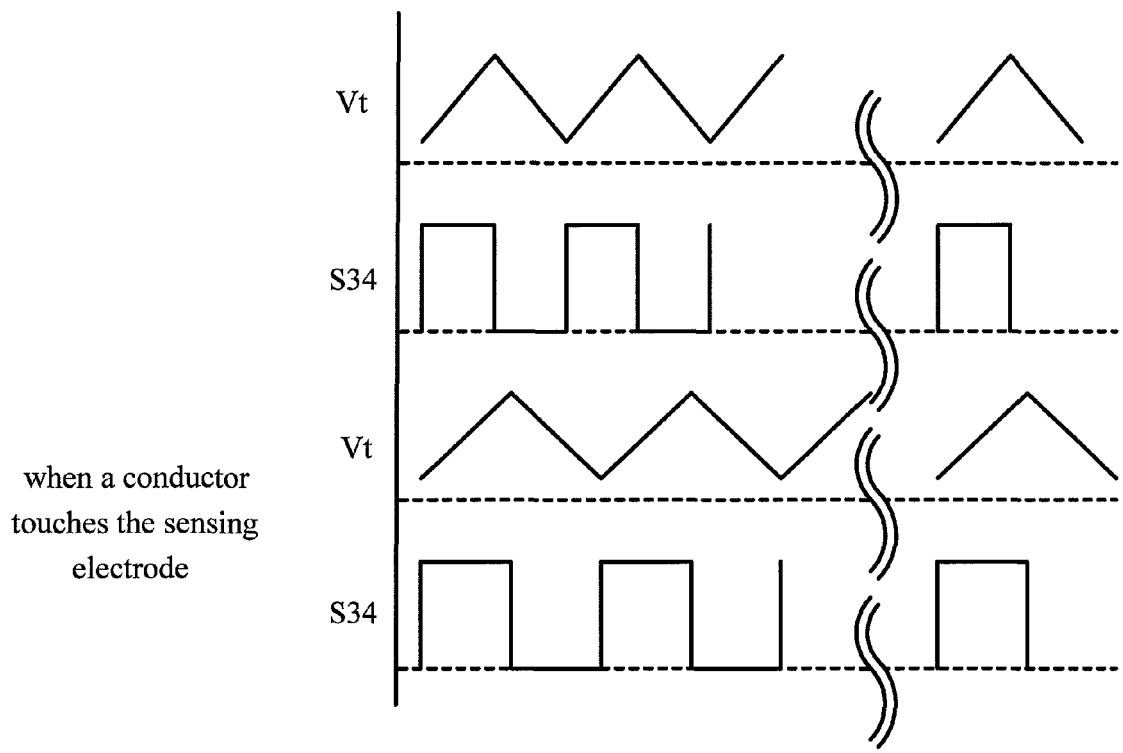
FIG. 4 illustrates the operational waveform according an embodiment of FIG. 3 in the present invention.

FIG. 3 illustrates the circuit diagram depicting the capacitive sensor according to an embodiment of the present invention. The capacitive sensor includes a sensing electrode 31, a first comparator 32, a second comparator 33 and a control unit 34, wherein the sensing electrode includes a first conductor 311 and a second conductor 312. The sensing electrode is equivalent to an equivalent capacitance which the first conductor 311 and the second conductor 312 respectively are its inner electrode and outer electrode. FIG. 4 illustrates the operational waveform according an embodiment of FIG. 3 in the present invention. Referring to FIGS. 3 and 4, a second output terminal of the control unit 34 is set to a ground voltage at the beginning, and the voltage of the second conductor 312 is the ground voltage, and then the first output terminal of the control unit 34 gradually charges the first conductor 311.

When the voltage of the first conductor 311 is beyond the voltage of the second conductor 312, and the voltage difference between both voltages is greater than a threshold voltage Vt, in other words, the voltage of the positive input terminal of the first comparator 32 is greater than the voltage of the negative input terminal thereof the threshold voltage Vt, the first comparing signal S32 outputted from the first comparator 32 becomes the logic high voltage, that is, a positive saturation voltage of the first comparator 32; and the second comparing signal S33 outputted from the second comparator 33 keeps the logic low voltage, that is, a negative saturation voltage of the second comparator 33. When the control unit 34 receives the first comparing signal S32 which is the logic high voltage and the second comparing signal S33 which is the logic low voltage, the second output terminal of the control unit 34 discharges the second conductor 312 and its first output terminal charges the first conductor 311.

When the voltage of the second conductor 312 is beyond the voltage of the first conductor 311 and the voltage difference between both voltages is greater than the abovementioned threshold voltage Vt, that is, the voltage of the positive input terminal of the second comparator 33 is greater than the voltage of the negative input terminal thereof plus the threshold voltage Vt, the second comparing signal S33 outputted from the second comparator 33 is the logic high voltage; and the first comparing signal S32 outputted from the first comparator 32 is the logic low voltage. Then the control unit 34 receives the second comparing signal S33 which is the logic high voltage and the first comparing signal S32 which is the logic low voltage, the first output terminal of the control unit 34 discharges the first conductor 311 and the second output terminal thereof charges the second conductor 312. In addition, the control unit 34 outputs a sensing signal S34. In this embodiment, the sensing signal S34 is a periodic square wave with a fixed frequency.

The operation of the circuit is the same as an oscillator. The key factors of the oscillating frequency thereof are the first conductor 311 and the second conductor 312 of the sensing electrode 31. When a conductor, such as a finger, touches the first conductor 311 and the second conductor 312 of the sensing electrode 31, the equivalent capacitance thereof. Cx is increased, so that the period during which the control unit 34 charges/discharges the first conductor 311 and the second conductor 312 is increased. Thus, the period of the sensing signal S34 is comparatively increased shown as FIG. 4.

Figure 5:
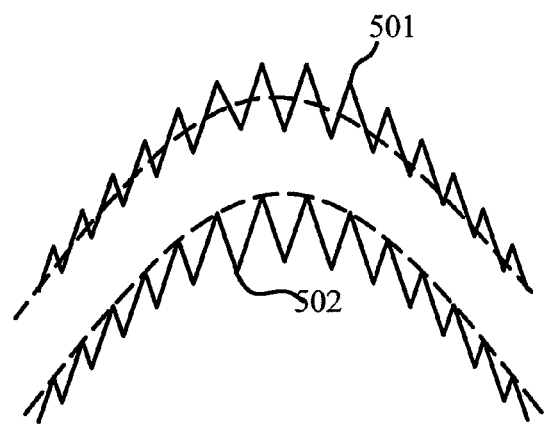
FIG. 5 illustrates voltage waveforms of the first conductor 311 and second conductor 312 when AC power interference is come according to an embodiment of the present invention.

Because the abovementioned embodiment is analogous to detecting the relative variation of both electrode of the capacitance Cx. When the interference of the AC power source occurs, the both electrodes of the capacitance Cx, the first conductor 311 and the second conductor 312, are interfered at the same time, thus the voltage of the first conductor 311 and the voltage of the second conductor 312 are varied in the same phase. However, the relative voltage between the first conductor 311 and the second conductor 312 is not affected by the interference of the AC power source. FIG. 5 illustrates voltage waveforms of the first conductor 311 and second conductor 312 when AC power interference is come according to an embodiment of the present invention. Referring to FIG. 5, the symbol 501 represents the voltage waveform of the first conductor 311, and the symbol 502 represents the voltage waveform of the second conductor 312. Since the differential mode detecting is adopted in the embodiment of the present invention, the voltages of the positive terminals and the negative terminals of the first comparator 32 and the second comparator 33 are affected by the interference of the AC power source, the voltage difference between each negative terminal and the corresponding positive terminal does not change through the interference of the AC power source.

Thereinafter, another embodiment is provided for one of ordinary skill in the art to implement the essence of the present invention.

Figure 6:
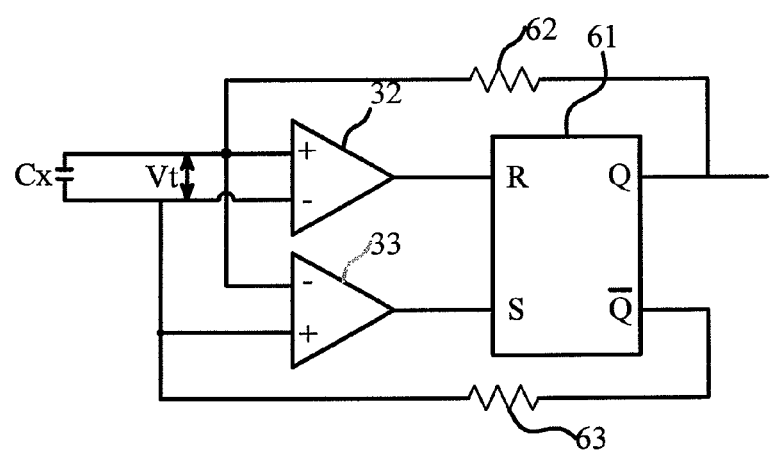
FIG. 6 illustrates a circuit diagram depicting a capacitive sensor according to an embodiment of FIG. 3 in the present invention.

FIG. 6 illustrates a circuit diagram depicting a capacitive sensor according to an embodiment of FIG. 3 in the present invention. Referring to FIG. 6, the control unit 34 is implemented by a RS flip-flop 61, a first impedance 62 and a second impedance 62. When the R terminal of the RS flip-flop 61 received the logic high voltage and the S terminal thereof receives the logic low voltage, the Q terminal thereof outputs the logic high voltage and the inverted Q terminal thereof outputs the logic low voltage. Therefore, the second conductor 312 discharges to the inverted Q terminal through the second impedance 63 and the Q terminal charges the first conductor 311 through the first impedance 62. In contrast, when the R terminal of the RS flip-flop 61 receives the logic low voltage and the S terminal thereof receives the logic high voltage, the Q terminal thereof outputs the logic low voltage and the inverted Q terminal thereof outputs the logic high voltage. Therefore, the inverted Q terminal thereof charges the second conductor 311 through the second impedance 63 and the first conductor is discharged to the Q terminal. The operation waveform is as FIG. 3, and the detail description is omitted. In this embodiment, the first impedance 62 and the second impedance 63 can be implemented by resistor. However, one of ordinary skill in the art should know that impedance also can be implemented by a constant current source or a transistor, thus the present invention is not limited to the abovementioned embodiment. In addition, the RS flip-flop 61 can be replaced by a JK flip-flop, the detail description is omitted.

Figure 7:
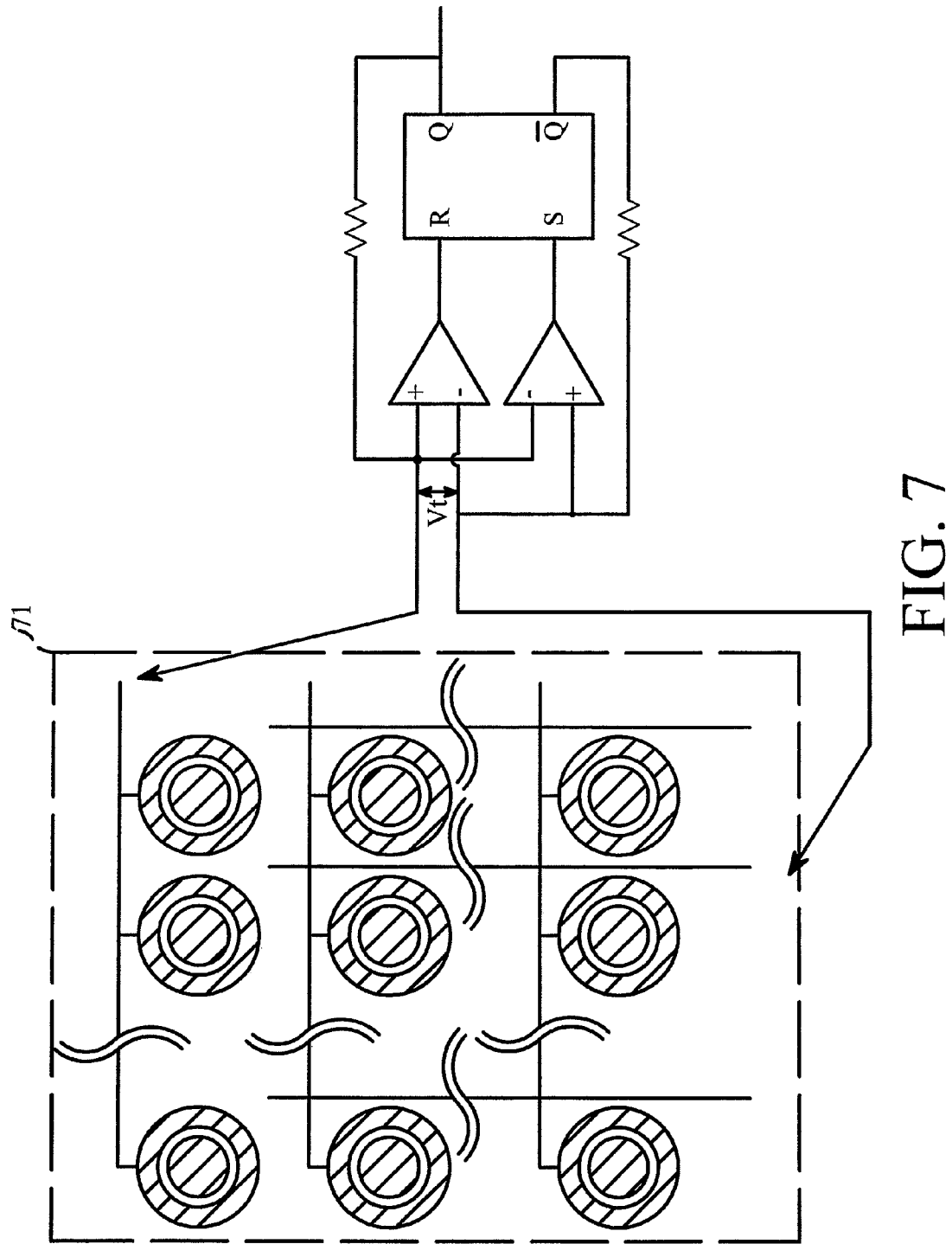
FIG. 7 illustrates a circuit diagram depicting a capacitive sensor according to an embodiment of FIG. 3 in the present invention.

FIG. 7 illustrates a circuit diagram depicting a capacitive sensor according to an embodiment of FIG. 3 in the present invention. Referring to FIG. 7, the difference between the circuit in FIG. 7 and the circuit in FIG. 6 is that the circuit in FIG. 7 includes M×N sensing electrodes 71 which are arranged as a matrix. The embodiment uses TDM (time division multiplexing) to sense each abovementioned sensing electrode 71. The operation includes the steps of:

In the first step, the sensing period is divided into M×N time intervals.

In the second step, the positive terminal of the first comparator 32 is coupled to the first conductor of the $i^{th}$ sensing electrode, the negative terminal thereof is coupled to the second conductor of the $i^{th}$ sensing electrode, the negative terminal of the second comparator 33 is coupled to the first conductor of the $i^{th}$ sensing electrode, and the positive terminal thereof is coupled to the second conductor of the $i^{th}$ sensing electrode in the $i^{th}$ interval.

In the third step, it is determined whether a conductor touches the $i^{th}$ sensing electrode according to the period of the sensing signal S during the $i^{th}$ period.

Figure 8:
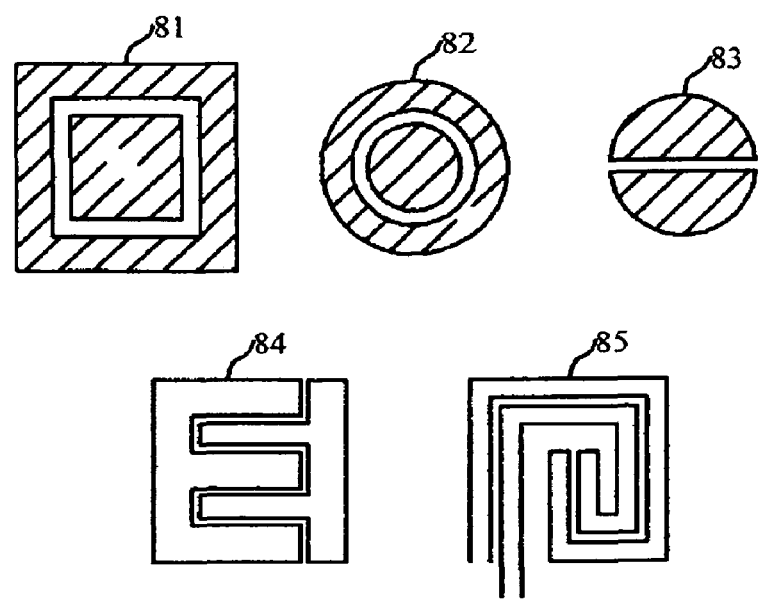
FIG. 8 illustrates different structures of the sensing electrode according to an embodiment of the present invention.

FIG. 8 illustrates different structures of the sensing electrode according to an embodiment of the present invention. Referring to FIG. 8, the symbols 81 to 85 respectively represents the different structures of the implementation of the sensing electrode. The design of the structure of the sensing electrode is considered that a conductor, especially a finger, has to be able to touch two conductors of the sensing electrode. Thus, the present invention is not limited to the abovementioned 5 structures.

To sum up, the essence of the present invention is to apply the principle of the oscillator, where the first conductor of the sensing electrode and the second conductor of the sensing electrode are alternately charged and discharged. Because the present invention is for detecting the voltage difference between the first conductor and the second conductor, where the variation of the voltage of the first conductor and the variation of the voltage of the second conductor are the same phase when the interference of the AC power source occurs. Thus, the relative value thereof is not subjected to the interference of the AC power source to change.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A capacitive sensor, comprising:
   a pair of sensing electrodes, wherein the pair of sensing electrodes comprises a first electrode and a second electrode, the first sensing electrode comprising a first conductor and the second sensing electrode comprising a second conductor;
   a first comparator, a positive input terminal thereof coupled to the first conductor, a negative input terminal thereof coupled to the second conductor, wherein the output terminal thereof outputs a first comparing signal according to voltages of the positive input terminal thereof and the negative input terminal thereof;
   a second comparator, a positive input terminal thereof coupled to the second conductor, the negative input terminal thereof coupled to the first conductor, wherein the output terminal thereof outputs a second comparing signal according to voltages of the positive input terminal thereof and the negative input terminal thereof; and
   a control unit, receiving the first comparing signal and the second comparing signal, a first output terminal thereof coupled to the first conductor, a second output terminal thereof coupled to the second conductor, outputting a sensing signal according to the first comparing signal and the second comparing signal, wherein the first output terminal thereof charges the first conductor when the first comparing signal is a first logic voltage and the second comparing signal is a second logic voltage, the second output terminal thereof charges the second conductor when the first comparing signal is the second logic voltage and the second comparing signal is the first logic voltage.

2. The capacitive sensor according to claim 1, wherein the control unit comprises:
   a RS flip-flop, comprising a reset terminal, a set terminal, a Q terminal and an inverted Q terminal, wherein the reset terminal thereof is coupled to the output terminal of the first comparator, the set terminal thereof is coupled to the output terminal of the second comparator, wherein the Q terminal outputs the sensing signal;
   a first impedance, a first terminal thereof coupled to the Q terminal of the RS flip-flop, a second terminal thereof coupled to the first conductor; and
   a second impedance, a first terminal thereof coupled to the inverted Q terminal, a second terminal thereof coupled to the second conductor.

3. The capacitive sensor according to claim 2, wherein the first impedance is a resistor.

4. The capacitive sensor according to claim 2, wherein the second impedance is a resistor.

5. The capacitive sensor according to the claim 1, wherein the capacitive sensor comprises a plurality of pairs of sensing electrodes, wherein each pair of sensing electrodes comprises a first and second electrode, and wherein the first electrode of each pair of the plurality of pairs of sensing electrodes comprises a first conductor, and the second electrode of each pair of the plurality of pairs of sensing electrodes comprises a second conductor, wherein, in an $i^{th}$ sensing period, the positive input terminal of the first comparator is coupled to the first conductor of the $i^{th}$ sensing electrode pair, the negative input terminal of the first comparator is coupled to the second conductor of the ith sensing electrode, and the negative input terminal of the second comparator is coupled to the first conductor of the $i^{th}$ sensing electrode pair, and the positive input terminal of the second comparator is coupled to the second conductor of the $i^{th}$ sensing electrode pair, determining whether an $i^{th}$ sensing electrode pair is touched by a conductor according to the period of the sensing signal in $i^{th}$ time interval.

* * * * *